(12) United States Patent
von Malm et al.

(10) Patent No.: US 9,917,077 B2
(45) Date of Patent: Mar. 13, 2018

(54) DISPLAY DEVICE

(71) Applicant: OSRAM Opto Semiconductors GmbH, Regensburg (DE)

(72) Inventors: Norwin von Malm, Nittendorf (DE); Alexander Martin, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/773,830

(22) PCT Filed: Mar. 5, 2014

(86) PCT No.: PCT/EP2014/054275
§ 371 (c)(1),
(2) Date: Sep. 9, 2015

(87) PCT Pub. No.: WO2014/139849
PCT Pub. Date: Sep. 18, 2014

(65) Prior Publication Data
US 2016/0027765 A1 Jan. 28, 2016

(30) Foreign Application Priority Data

Mar. 15, 2013 (DE) .................. 10 2013 102 667

(51) Int. Cl.
*H01L 25/16* (2006.01)
*H01L 27/15* (2006.01)
(Continued)

(52) U.S. Cl.
CPC ........ *H01L 25/167* (2013.01); *H01L 23/5386* (2013.01); *H01L 27/156* (2013.01);
(Continued)

(58) Field of Classification Search
CPC ... H01L 25/167; H01L 27/156; H01L 33/405; H01L 33/382
(Continued)

(56) References Cited

U.S. PATENT DOCUMENTS 5,893,721 A 4/1999 Huang et al.
8,258,533 B2 9/2012 Seo et al.
(Continued)

FOREIGN PATENT DOCUMENTS

CN 102117821 A 7/2011
CN 102550013 A 7/2012
(Continued)

OTHER PUBLICATIONS

Day, J., et al., "Ill-Nitride full-scale high-resolution microdisplays," Applied Physics Letters, vol. 99, Issue 3, Jul. 22, 2011, pp. 031116-1-031116-3.
(Continued)

*Primary Examiner* — Bo Fan
(74) *Attorney, Agent, or Firm* — Slater Matsil, LLP

(57) ABSTRACT

A display device includes at least one semiconductor body, which has a semiconductor layer sequence, which has an active region provided for producing radiation and forms a plurality of pixels. The device also includes a driver circuit that has a plurality of switches, which are each provided for controlling at least one pixel. A first metallization layer and/or the second metallization layer are electroconductively connected to at least one of the pixels. The first metallization layer and the second metallization layer are arranged overlapping one another in such a manner that, in a plan view onto the display device, the driver circuit is covered with at least one of the metallization layers at every point which overlaps with one of the pixels or is arranged between two adjacent pixels.

20 Claims, 3 Drawing Sheets

(51) Int. Cl.
  *H01L 33/40* (2010.01)
  *H01L 23/538* (2006.01)
  *H01L 29/786* (2006.01)
  *H01L 33/50* (2010.01)
  *H01L 33/38* (2010.01)
  *H01L 33/44* (2010.01)

(52) U.S. Cl.
  CPC ...... *H01L 29/78672* (2013.01); *H01L 33/405* (2013.01); *H01L 33/505* (2013.01); *H01L 33/382* (2013.01); *H01L 33/44* (2013.01); *H01L 2924/0002* (2013.01)

(58) Field of Classification Search
  USPC .......................................................... 257/72
  See application file for complete search history.

(56) References Cited

U.S. PATENT DOCUMENTS

| | | | |
|---|---|---|---|
| 8,324,650 | B2 | 12/2012 | Seo et al. |
| 8,633,875 | B2 | 1/2014 | Yamashita et al. |
| 8,716,724 | B2 | 5/2014 | von Malm et al. |
| 8,780,023 | B2 | 7/2014 | Ootorii |
| 8,823,024 | B2 | 9/2014 | Engl et al. |
| 9,019,440 | B2 | 4/2015 | Kuwabara |
| 9,196,653 | B2 | 11/2015 | Leatherdale et al. |
| 2004/0196605 | A1* | 10/2004 | Dinn ............... G08C 17/04 361/91.1 |
| 2012/0032218 | A1* | 2/2012 | Choi ................ H01L 33/08 257/98 |
| 2012/0119237 | A1 | 5/2012 | Leatherdale et al. |
| 2012/0189291 | A1 | 7/2012 | von Malm et al. |
| 2015/0014716 | A1 | 1/2015 | von Malm |
| 2015/0325598 | A1 | 11/2015 | Pfeuffer et al. |

FOREIGN PATENT DOCUMENTS

| | | |
|---|---|---|
| CN | 102576783 A | 7/2012 |
| CN | 104011864 A | 8/2014 |
| CN | 104854696 A | 8/2015 |
| DE | 102008011848 A1 | 9/2009 |
| DE | 102008062933 A1 | 7/2010 |
| DE | 102011056888 A1 | 6/2013 |
| JP | 2002141492 A | 5/2002 |
| JP | 2009175198 A | 8/2009 |
| JP | 2011139038 A | 7/2011 |
| JP | 2012513667 A | 6/2012 |
| JP | 2012164976 A | 8/2012 |
| JP | 2012227514 A | 11/2012 |
| JP | 2013501357 A | 1/2013 |
| WO | 2011014490 A2 | 2/2011 |
| WO | 2011039052 A1 | 4/2011 |
| WO | 2012039555 A2 | 3/2012 |
| WO | 2013092304 A1 | 6/2013 |
| WO | 2014090605 A1 | 6/2014 |

OTHER PUBLICATIONS

Liu, Z.J., et al., "P-34: Active Matrix Programmable Monolithic Light Emitting Diodes on Silicon (LEDoS) Displays," SID Symposium Digest of Technical Papers, vol. 42, Issue 1, Jun. 2011, pp. 1215-1218.

McKendry, J.J.D., et al., "Individually Addressable AlInGaN Micro-LED Arrays With CMOS Control and Subnanosecond Output Pulses," IEEE Photonics Technology Letters, vol. 21, No. 12, Jun. 15, 2009, pp. 811-813.

* cited by examiner

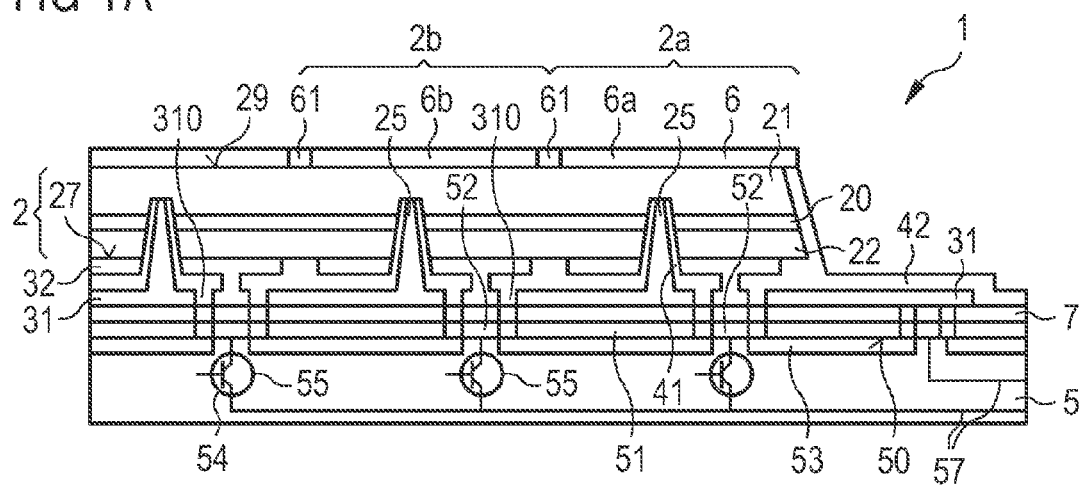
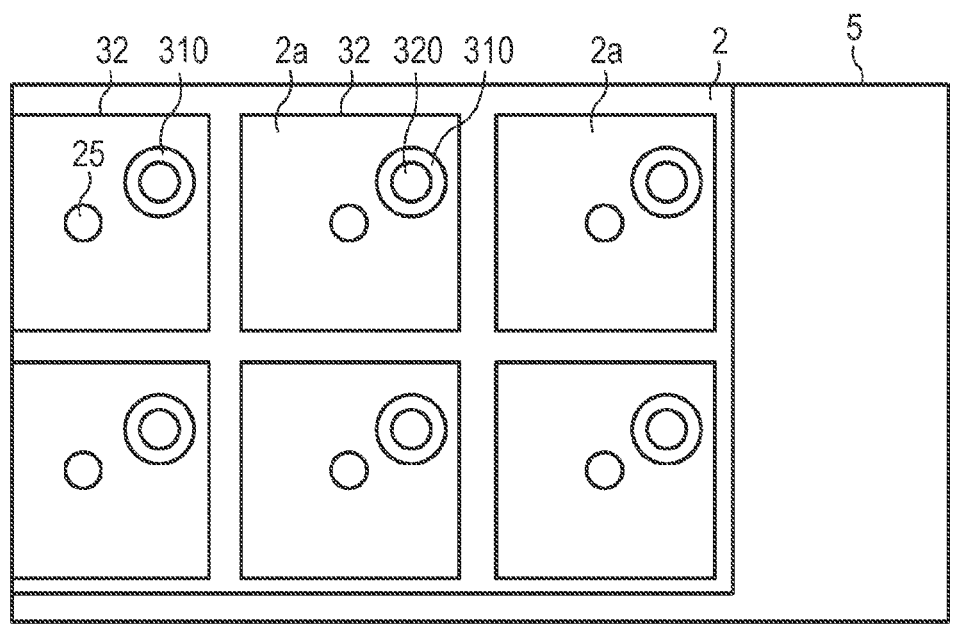

DISPLAY DEVICE

This patent application is a national phase filing under section 371 of PCT/EP2014/054275, filed Mar. 5, 2014, which claims the priority of German patent application 10 2013 102 667.2, filed Mar. 15, 2013, each of which is incorporated herein by reference in its entirety.

TECHNICAL FIELD

A display device is specified.

BACKGROUND

For display devices based on light-emitting diodes, individual light-emitting diodes can be mounted on a carrier, in which a driver circuit is integrated. Radiation which is emitted from the light-emitting diodes and absorbed in the carrier can result in malfunctions and degradation occurrences, however.

SUMMARY

Embodiments of the invention specify a display device that is distinguished by a high level of reliability and aging stability.

According to at least one embodiment of the display device, the display device comprises at least one semiconductor body. The semiconductor body comprises a semiconductor layer sequence, which comprises an active region provided for generating radiation and forms a plurality of pixels. A peak wavelength of the radiation generated in the active region is, for example, in the ultraviolet, visible, or infrared spectral range. The active region is arranged, for example, between a first semiconductor layer and a second semiconductor layer, wherein the first semiconductor layer and the second semiconductor layer advantageously have different conduction types from one another. During the production of the display device, the pixels of a semiconductor body can originate from a shared semiconductor layer sequence. This means that the semiconductor layers, in particular the active regions of the individual pixels of the semiconductor body, are identical with respect to the material composition and the layer thicknesses thereof, neglecting production-related variations, which occur in the lateral direction over a semiconductor wafer.

A lateral direction is understood as a direction which extends in parallel to a main plane of extension of the semiconductor layers of the semiconductor layer sequence.

According to at least one embodiment of the display device, the display device comprises a driver circuit. The driver circuit comprises a plurality of switches, which are each provided for controlling at least one pixel.

At least one switch, in particular precisely one switch, is preferably associated with each pixel. In operation of the display device, every pixel is activatable by means of the associated switch. Therefore, multiple pixels can be activated simultaneously; in particular, all pixels can be activated simultaneously for radiation emission. For example, an active matrix driver circuit for the pixels is formed by means of the switches.

According to at least one embodiment of the display device, the display device comprises a carrier. The at least one semiconductor body is arranged on the carrier. The carrier contains, for example, a semiconductor material, such as silicon or germanium, or a ceramic, for example, aluminum nitride, aluminum oxide, or boron nitride.

According to at least one embodiment of the display device, the driver circuit is integrated in the carrier. In this case, in particular a semiconductor material, such as silicon, is suitable for the carrier. "Integrated in the carrier" means in this context that at least one subregion of the driver circuit is formed by the carrier, for example, a semiconductor region of a switch.

According to at least one embodiment of the display device, the driver circuit is arranged between the at least one semiconductor body and the carrier. The carrier is used in this case in particular for the mechanical stabilization of the semiconductor layer sequence and can therefore be selected independently of its electrical properties. For example, the driver circuit is formed by means of layers deposited on the semiconductor body. For example, the driver circuit can comprise a polycrystalline semiconductor material, in particular polycrystalline silicon. For a mechanical connection between the at least one semiconductor body and the carrier, a connecting layer can be arranged at least regionally between the driver circuit and the carrier.

According to at least one embodiment of the display device, the display device comprises a first metallization layer between the driver circuit and the semiconductor body. The first metallization layer can be electrically conductively connected to the pixels, in particular in each case to the first semiconductor layer of the pixels. In other words, the first metallization layer fulfills the function of a terminal layer for the first semiconductor layer. Notwithstanding this, the first metallization layer can be electrically insulated from the pixels. In this case, the first metallization layer thus does not fulfill an electrical function. The first metallization layer is arranged in particular between the carrier and the semiconductor body.

According to at least one embodiment of the display device, the display device comprises a second metallization layer between the driver circuit and the semiconductor body. The second metallization layer adjoins the semiconductor body, for example, in particular the second semiconductor layer. The second metallization layer is in particular electrically insulated from the first metallization layer. The first metallization layer is, for example, arranged at least regionally between the driver circuit and the second metallization layer in the vertical direction, i.e., in a direction extending perpendicularly to the main plane of extension of the semiconductor layers of the semiconductor layer sequence. The second metallization layer is arranged in particular between the carrier and the semiconductor body.

The first metallization layer and/or the second metallization layer can be implemented as reflective for the radiation to be generated in the active region in operation. The reflectivity is preferably at least 50%, particularly preferably at least 70% for the radiation generated in the active region. The first metallization layer and/or the second metallization layer thus fulfill the function of a mirror layer, which deflects the radiation emitted in the direction of the driver circuit. The first metallization layer and/or the second metallization layer can furthermore be formed in a single layer or multiple layers.

According to at least one embodiment of the display device, the first metallization layer and/or the second metallization layer are electrically conductively connected to at least one of the pixels.

According to at least one embodiment of the display device, the first metallization layer and the second metallization layer are arranged overlapping with one another so that the driver circuit is covered with at least one of the metallization layers, in a top view of the display device at any point which overlaps with one of the pixels or is arranged between two adjacent pixels. In particular, no direct optical path exists between the active region and the driver circuit. That is to say, radiation emitted from the active region cannot penetrate directly into the driver circuit and possibly into the carrier, i.e., not without a preceding reflection on the first metallization layer and/or on the second metallization layer. In an edge region of the carrier, for example, laterally outside the at least one semiconductor body, the carrier can be exposed at points, however.

In at least one embodiment of the display device, the display device comprises at least one semiconductor body, which comprises a semiconductor sequence, which comprises an active region provided for generating radiation and forms a plurality of pixels. Furthermore, the display device comprises a driver circuit, wherein the driver circuit comprises a plurality of switches, which are each provided for controlling at least one pixel. A first metallization layer and a second metallization layer, which is electrically insulated from the first metallization layer, are arranged between the driver circuit and the semiconductor body. The first metallization layer and/or the second metallization layer are electrically conductively connected to at least one of the pixels. The first metallization layer and the second metallization layer are arranged overlapping one another so that the driver circuit is covered with at least one of the metallization layers in a top view of the display device at any point which overlaps with one of the pixels or is arranged between two adjacent pixels.

By means of the metallization layers arranged in an overlapping manner, radiation which is generated in active operation and emitted in the direction of the driver circuit can be prevented from being absorbed therein and causing malfunctions or degradation occurrences.

According to at least one embodiment of the display device, the first metallization layer and the second metallization layer are electrically conductively connected to at least one of the pixels.

According to at least one embodiment of the display device, the first metallization layer or the second metallization layer form a shared contact for multiple pixels, in particular for all pixels of the display device. For example, the first metallization layer forms a shared electrical contact for multiple pixels and the second semiconductor layer of the pixels is electrically conductively connected by means of the second metallization layer to one of the switches in each case, or vice versa.

According to at least one embodiment of the display device, the second metallization layer adjoins the semiconductor layer sequence and is severed between two adjacent pixels. The second metallization layer thus defines the region in which the charge carriers are injected in operation via the second semiconductor layer into the active regions. In other words, the second metallization layer is subdivided into a plurality of regions spaced apart from one another, wherein precisely one subregion is associated with each pixel in particular.

According to at least one embodiment of the display device, the second metallization layer is completely covered by the at least one semiconductor body in a top view of the display device. In other words, the individual regions of the second metallization layer do not protrude in the lateral direction at any point beyond the respective associated semiconductor body.

According to at least one embodiment of the display device, the first metallization layer has a cutout in each case for each pixel. In particular, the second metallization layer is electrically conductively connected in the cutout to the associated switch of the driver circuit. In a top view of the display device, the cutout completely overlaps with the respective associated pixel and in particular also with the second metallization layer. The cutout thus does not extend in the lateral direction beyond the pixel. In other words, the first metallization layer is only omitted at points which are covered with the second metallization layer. In particular, the first metallization layer completely covers the intermediate spaces between the pixels in a top view of the display device.

According to at least one embodiment of the display device, the cutout has a ring-shaped border. For example, the border has a circular or elliptical basic shape.

According to at least one embodiment of the display device, a plurality of semiconductor bodies each having a plurality of pixels is arranged on the carrier. During the production of the display device, the individual semiconductor bodies can be positioned sequentially or simultaneously on the carrier. A spacing between adjacent semiconductor bodies can be greater than a spacing between adjacent pixels of a semiconductor body.

According to at least one embodiment of the display device, the first metallization layer and the second metallization layer are arranged overlapping with one another so that the carrier is covered with at least one of the metallization layers in a top view of the display device at any point which overlaps with one of the semiconductor bodies or is arranged between two adjacent semiconductor bodies. Thus, no direct optical path exists from the active regions of the semiconductor bodies to the carrier in the region between two adjacent semiconductor bodies.

According to at least one embodiment of the display device, the active region is arranged between a first semiconductor layer and a second semiconductor layer, wherein the semiconductor layer sequence comprises at least one recess, which extends from a rear side of the semiconductor layer sequence, which faces toward the driver circuit, through the active region into the first semiconductor layer and is provided for the electrical contacting of the first semiconductor layer. In particular, the first metallization layer is electrically conductively connected in the recess to the first semiconductor layer. The first semiconductor layer can be electrically contacted from the side of the semiconductor layer sequence facing toward the driver circuit by means of the first metallization layer. In particular in an embodiment in which the first semiconductor layer extends continuously over all pixels, a single recess can already be sufficient for the entire semiconductor body. However, a plurality of recesses can also be provided. For example, the number of the recesses in a semiconductor body is at least as great as the number of the pixels of the semiconductor body. This can be applied both in an embodiment in which the first semiconductor layer is connected via the first metallization layer to a switch, and also in an embodiment in which the first metallization layer extends continuously over the pixels. In particular in the case of a comparatively large lateral extension of the individual pixels, two or more recesses per pixel can also be expedient. An introduction of charge carriers into the active region of the pixel which is homogeneous in the lateral direction is thus simplified.

According to at least one embodiment of the display device, the pixels are electrically contacted from a radiation exit surface of the semiconductor body which faces away from the driver circuit. In particular, the first semiconductor layer of the pixels is electrically contacted from the radiation exit surface. For example, a terminal layer is arranged on the semiconductor body. The terminal layer can form a shared contact for multiple or all first semiconductor layers of the semiconductor body. In this embodiment, recesses through the active region for contacting the first semiconductor layer can be omitted. The terminal layer is advantageously transparent or at least translucent for the radiation generated in the active region. For example, the terminal layer contains a TCO (transparent conductive oxide) material, for example, indium-tin oxide (ITO) or zinc oxide.

According to at least one embodiment of the display device, a growth substrate for the semiconductor layer sequence is removed. In particular, the growth substrate for the semiconductor layer sequence is completely or at least regionally removed or completely or at least regionally thinned. The carrier mechanically stabilizes the semiconductor layer sequence, so that the growth substrate is no longer necessary for this purpose. The display device is preferably completely free of the growth substrate. The risk of optical crosstalk between adjacent pixels in operation of the display device can thus be reduced. Notwithstanding this, however, it can also be sufficient to thin the growth substrate only down to a predefined residual thickness.

According to at least one embodiment of the display device, the active region extends continuously over a plurality of pixels, in particular over all pixels of the semiconductor body. The active region is thus formed as coherent and is optionally only penetrated by the at least one recess. An additional production step for severing the active region for the individual pixels is thus not necessary.

According to at least one embodiment of the display device, the active region is subdivided into a plurality of segments, which each form one pixel, wherein the segments originate from the shared semiconductor layer sequence. The subdivision between adjacent pixels can be formed, for example, by means of a trench in each case, which at least severs the active region. In particular, the trench can sever the entire semiconductor layer sequence. By means of the subdivision into segments, a separation of the charge carrier injection between adjacent pixels can be achieved in a simplified manner. In addition, optical crosstalk can be reduced further.

Alternatively, the trench can also only be formed in the first semiconductor layer. This means the trench does not sever the active region. By means of such a trench, the optical separation between the pixels can be improved, without the active region being severed.

According to at least one embodiment of the display device, a radiation conversion element is arranged on a side of the semiconductor layer sequence facing away from the driver circuit.

The radiation conversion element is provided in particular for the purpose of converting at least a part of the radiation generated in the active region having a first peak wavelength into secondary radiation having a second peak wavelength, which is different from the first peak wavelength.

According to at least one embodiment of the display device, the radiation conversion element extends continuously over multiple pixels.

According to at least one embodiment of the display device, the radiation conversion element has a plurality of segments, with each of which at least one pixel is associated. For example, three or more pixels can each be combined to form a color triple, which is provided for generating radiation in the red, green, and blue spectral ranges. Such a display device is suitable for the full color display of stationary or moving images.

The production of the display device can be performed in a wafer composite, wherein multiple display devices originate due to the isolation of the wafer composite, for example, by sawing or by means of a laser cutting method. The isolation into the display devices is performed in particular only after the fastening of the semiconductor bodies on the carrier.

BRIEF DESCRIPTION OF THE DRAWINGS

Further features, embodiments, and advantages result from the following description of the exemplary embodiments in conjunction with the figures.

In the figures:

FIGS. 1A and 1B show a first exemplary embodiment of a display device in a schematic sectional view (FIG. 1A) and associated top view (FIG. 1B);

Figure 2:
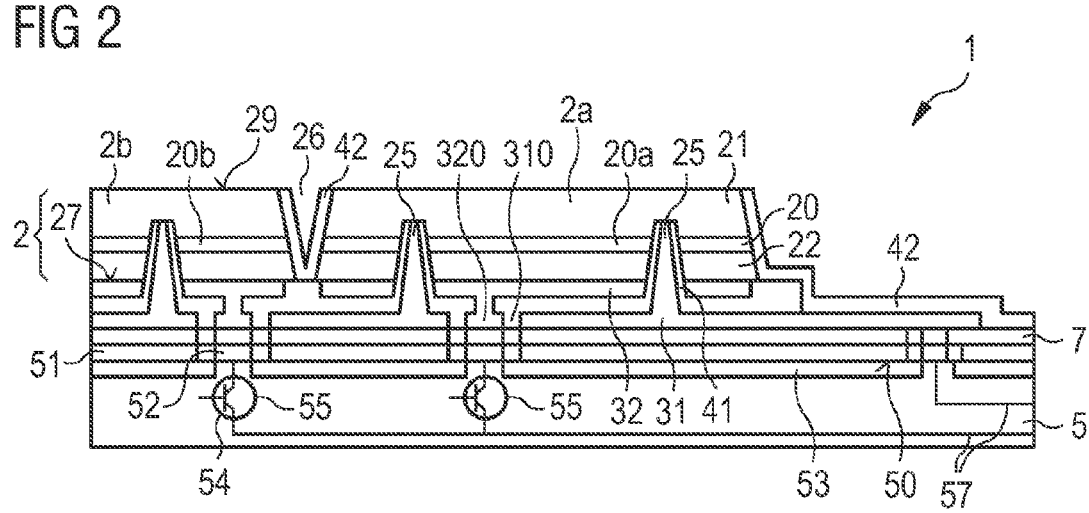
FIGS. 2 and 3 show a second or third exemplary embodiment, respectively, for a display device in a schematic sectional view.

Identical, equivalent, or identically acting elements are provided with the same reference signs in the figures.

The figures and the size relationships of the elements shown in the figures among one another are not to scale. Rather, individual elements and in particular layer thicknesses can be shown exaggeratedly large for better illustration capability and/or for better comprehension.

DETAILED DESCRIPTION OF ILLUSTRATIVE EMBODIMENTS

FIG. 1A schematically shows a first exemplary embodiment of a display device 1 in a sectional view. The display device comprises a plurality of pixels, which are arranged adjacent to one another, in particular in a matrix. For simplified illustration, a detail of the display device having a first pixel 2a and a second pixel 2b is shown in the figure.

The display device 1 comprises a semiconductor body having a semiconductor layer sequence 2. The semiconductor body extends in a vertical direction between a radiation exit surface 29 and a rear side 27, which is opposite to the radiation exit surface. The semiconductor layer sequence comprises an active region 20 provided for generating radiation. The active region is arranged between a first semiconductor layer 21 of a first conduction type and a second semiconductor layer 22 of a second conduction type. For example, the first semiconductor layer can be formed as n-conductive and the second semiconductor layer can be formed as p-conductive or vice versa. A plurality of recesses 25 is implemented in the semiconductor layer sequence 2, which extend from the rear side 27 through the second semiconductor layer 22 and the active region 20 into the first semiconductor layer 21. The recesses end in particular in the first semiconductor layer.

The active region 20 can be provided for generating radiation in the visible spectral range, in the ultraviolet spectral range, or in the infrared spectral range. In particular, the active region can comprise a quantum well structure, for example, a multiple quantum well structure.

The semiconductor layer sequence 2, in particular the active region 20, preferably comprises a III-V compound semiconductor material. The semiconductor material can contain in particular at least one group III element from the group consisting of Ga, Al, and In and at least one group V element from the group consisting of N, P, and As.

III-V compound semiconductor materials are suitable for generating radiation in the ultraviolet ($Al_xIn_yGa_{1-x-y}N$) via the visible ($Al_xIn_yGa_{1-x-y}N$, in particular for blue to green radiation, or $Al_xIn_yGa_{1-x-y}P$, in particular for yellow to red radiation) up into the infrared ($Al_xIn_yGa_{1-x-y}As$) spectral range. For this purpose, in each case $0 \leq x \leq 1$, $0 \leq y \leq 1$, and $x+y \leq 1$, in particular with $x \neq 1$, $y \neq 1$, $x \neq 0$, and/or $y \neq 0$. High internal quantum efficiencies when generating radiation can furthermore be achieved using III-V compound semiconductor materials, in particular from the mentioned material system.

The display device 1 furthermore comprises a carrier 5, on which the semiconductor layer sequence 2 is arranged and fastened. A driver circuit 54 having a plurality of switches 55 is integrated in the carrier 5, the switches being able to be designed, for example, as individual transistors or as a circuit having multiple transistors and one or more capacitors. A first connecting surface 51 is formed on a main surface 50 of the carrier 5 facing toward the semiconductor layer sequence 2. The first connecting surface is provided for an electrically conductive connection to the first semiconductor layer 21 of the pixels 2a, 2b. The first connecting surface is formed as a coherent surface. Furthermore, a plurality of second connecting surfaces 52 is formed on the main surface of the carrier. The second connecting surfaces are each provided for an electrically conductive connection between the switches 55 and the associated pixels of the semiconductor body 2.

In a top view of the display device 1, an insulating region 53 is formed in each case between adjacent second connecting surfaces 52. The insulating region insulates the carrier 5 from the first metallization layer 51. Furthermore, feed lines 57 are formed in the carrier 5, via which the pixels of the display device can be activated via an electrical control circuit.

The carrier 5 can be designed, for example, as a silicon carrier, in which the switches 55 can be embodied, for example, in CMOS (complementary metal oxide semiconductor) technology. In addition to the switches 55, the carrier can also comprise further electronic components for activating the display device 1, for example, a shift register or a programmable logic component.

In addition to the electrical activation of the pixels 2a, 2b, the carrier 5 is used for the mechanical stabilization of the semiconductor layer sequence 2. A growth substrate for the preferably epitactic deposition of the semiconductor layer sequence is no longer required for this purpose and can therefore be removed during the production of the display device.

The semiconductor body having the semiconductor layer sequence 2 is mechanically and in particular also thermally conductively connected to the carrier 5 via a connecting layer 7, so that the waste heat generated in operation can be dissipated efficiently via the carrier. For example, soldering, such as soldering by means of solder paste, silver sintering, a direct bonding method, or contacting by contact protrusions (bumps) is suitable for the production of the connecting layer, wherein an underfill material can be formed between the individual contact protrusions to increase the mechanical stability. In particular a metal, for example, gold, silver, copper, nickel, tin, or a metallic alloy having at least one of the mentioned materials, for example, gold-tin, copper-silver-tin, indium-tin, or nickel-tin is suitable for the connecting layer 7.

A first metallization layer 31 and a second metallization layer 32 are arranged between the semiconductor layer sequence 2 and the carrier 5 for the electrical connection of the pixels 2a, 2b of the semiconductor layer sequence 2 to the carrier 5. The first metallization layer 31 extends through the recesses 25 and electrically contacts the first semiconductor layer 21. Accordingly, the second metallization layer 32 electrically contacts the second semiconductor layer 22 and directly adjoins the second semiconductor layer. The metallization layers are preferably designed as reflective for the radiation generated in the active region 20. For example, silver is distinguished by a particularly high reflectivity in the visible and in the ultraviolet spectral ranges. Alternatively, another metal, for example, aluminum, nickel, gold, rhodium, or palladium or a metallic alloy having at least one of the mentioned materials can also be used, for example, a silver-palladium alloy or Au:Ge. The metallization layers 31, 32 can also be designed as multilayered.

In a top view of the display device 1, the first metallization layer 31 and the second metallization layer 32 are arranged overlapping with one another such that the main surface 50 of the carrier 5 having the driver circuit 54 is covered with at least one of the metallization layers in the lateral direction at every point which overlaps with one of the pixels 2a, 2b or is arranged between two adjacent pixels. Interruptions in the first metallization layer and the second metallization layer, for example, for the electrical contact conduction or the definition of the pixels, are thus arranged offset in relation to one another. Using such an arrangement, the carrier having the driver circuit can also be protected from radiation, which is emitted in operation of the display device 1 from the active region 20 in the direction of the carrier 5, in the case of individual activation ability of the individual pixels, in particular by means of an active matrix driver circuit. This radiation is obstructed continuously by at least one of the metallization layers in the lateral direction, i.e., at any point at an entry into the carrier 5, and can furthermore be at least partially deflected in the direction of the radiation exit surface. The carrier 5 is thus prevented from being subjected to the generated radiation, in particular below the active regions and in the lateral direction between the active regions. The risk of a malfunction or degradation of the driver circuit 54 induced by the radiation is thus minimized.

The first metallization layer 31 comprises a plurality of cutouts 310. Through contacts 320 are formed in the cutouts, via which the second metallization layer 32 of the respective pixels is electrically conductively connected to the associated second connection areas 52. In a top view of the display device, the through contacts 310 are completely covered by the second metallization layer 32. The recesses 310 are preferably formed in a ring shape. It has been shown that the area is thus minimized on which the semiconductor body 2 is not mechanically supported by the connecting layer 7. The risk of cracking is thus reduced, for example, in comparison to linear cutouts. Of course, another geometrical basic shape is also conceivable for the cutout, for example, a polygonal, for example, a rectangular, in particular square, or hexagonal basic shape.

In the exemplary embodiment shown, the second metallization layer 32 for each pixel 2a, 2b forms an electrically conductive connection to the second connecting surface 52 of the associated switch 55. The first semiconductor layer 21 is continuously electrically contacted by means of the first metallization layer 31, so that the first metallization layer forms a shared contact for all pixels 2a, 2b of the display device and is directly connected to a feed line 57.

The shared contact can be connected at one or more points to a feed line 57 or can be led directly out of the display device 1.

A first insulation layer 41, for example, a silicon oxide layer, is arranged between the first metallization layer 31 and the second metallization layer 32. The insulation layer is used for electrical insulation between the first metallization layer 31 and the second metallization layer 32 and the electrical insulation of the first metallization layer from the second semiconductor layer 22 and the active region 20 in the region of the recesses 25. The lateral surfaces of the semiconductor layer sequence 2, in particular the active region 20, are covered with a second insulation layer 42. The lateral surfaces can have positive flank angles as shown in FIG. 1A. In this case, the lateral extension of the semiconductor layer sequence increases in the direction of the carrier. Alternatively, however, negative flank angles can also be provided.

In operation of the display device 1, the pixels 2a, 2b can be operated independently of one another and in particular simultaneously via the switches 55. In contrast to an embodiment in which the pixels are connected to contact lines in rows and columns, the number of the pixels can thus be increased, without the switching times per pixel having to be reduced at a predefined repetition frequency for this purpose. Thus, the current through the pixels does not have to be increased for an equal brightness of the pixels. In spite of the individual activation capability of the pixels, it is ensured by means of the metallization layers overlapping as described that the radiation generated in operation cannot penetrate into the carrier 5 and result in damage or malfunction of the driver circuit 54 therein.

In the exemplary embodiment shown, the semiconductor layer sequence 2 extends continuously over the pixels 2a, 2b. The active region 20 is therefore formed as a coherent region. The lateral extension of a pixel results in this exemplary embodiment essentially via the lateral extension of the second metallization layer 32. The regions of the second metallization layer separated from one another by the interruptions between the pixels thus determined the shape of the pixels. The pixels can have a square basic shape as shown in FIG. 1B. Notwithstanding this, however, another basic shape, in particular an at least regionally curved or polygonal, for example, a triangular, rectangular, or hexagonal basic shape, can also be used.

In the region of the interruptions between the regions of the second metallization layer 32 of the pixels 2a, 2b, the first metallization layer 31 extends continuously in a top view of the display device 1, so that the main surface 50 of the carrier 5 is not visible at any point between the pixels. The radiation generated in operation is thus efficiently prevented from entering the carrier 5 having the driver circuit 54.

The embodiment of the first connecting surface 51 and the second connecting surfaces 52 is mirror equivalent to the embodiment of the first metallization layer 31 and the through contacts 320, so that the first connecting surface 51 having the first metallization layer and the second connecting surfaces having the through contacts can be connected to one another in a simple manner via the connecting layer 7 during the production.

The number of the recesses 25 can be varied in broad limits in dependence on the size of the pixels and the transverse conductivity of the first semiconductor layer. Notwithstanding the illustrated exemplary embodiment, each pixel thus does not have to have a separate recess 25 or even multiple separate recesses 25. Rather, multiple pixels arranged adjacent to one another can also have a shared recess 25. In the extreme case, a single recess can be sufficient for the entire display device.

An edge length of the individual pixels 2a, 2b can be varied in broad ranges. For example, the edge length can be between 1 µm inclusive and 1 mm inclusive. For the formation of a pixelated headlight, for example, for an adaptive front lighting system (AFS) in a vehicle, the edge length is, for example, preferably between 20 µm inclusive and 150 µm inclusive. For a projection display, the edge length is preferably between 1 µm inclusive and 5 µm inclusive.

The non-emitting intervals between adjacent pixels can be between 0.5 µm inclusive and 20 µm inclusive.

A radiation conversion element 6 is formed on the radiation exit surface 29 of the semiconductor layer sequence. In the exemplary embodiment shown, the radiation conversion element is formed as a coherent element, which comprises a plurality of segments 6a, 6b. Precisely one segment is associated with each pixel. A separating web 61 is formed in each case between adjacent segments. The segments 6a, 6b can be optically isolated from one another by means of the separating webs. The optical separation between the pixels 2a, 2b is thus increased. In particular in dependence on the thickness of the conversion element and/or the concentration of the scattering centers in the conversion element, the separating webs can also be omitted.

For a display device 1 which is provided for displaying full-color stationary or moving images, the segments 6a, 6b can be provided for generating radiation having a secondary wavelength having different peak wavelengths from one another. For example, by means of three segments 6a, 6b, a color triple can be formed for generating radiation in the red, green, and blue spectral ranges. Of course, it is also conceivable not to form the radiation conversion element 6 as coherent and to apply the radiation conversion element in the form of individual segments, which are mechanically separated from one another, to the respective pixels 2a, 2b.

The radiation conversion element 6 can be fastened in prefinished form on the radiation exit surface 29 or can be formed directly on the radiation exit surface. Furthermore, the radiation conversion element can be formed, for example, by means of ceramic particles, quantum dots, or organic molecules. These can be embedded in a matrix material, for example, a polymer matrix material, such as a silicone or an epoxy or a hybrid material having a silicone and an epoxy. Alternatively, the radiation conversion element can also be formed as a ceramic radiation conversion element, in which the particles provided for the radiation conversion alone form a ceramic by sintering, for example, or are joined together with the aid of further materials to form a ceramic.

For a pixelated headlight, the segments 6a, 6b of the radiation conversion element 6 can also be formed identically. For example, the segments can be provided for the radiation conversion of blue radiation generated in the active region 20 into secondary radiation in the yellow spectral range, so that light which appears white to the human eye is emitted.

Alternatively, the radiation conversion element 6 can be formed as a continuous element, which extends over the pixels 2a, 2b. The radiation conversion element can be formed in one piece in particular.

Notwithstanding the described exemplary embodiment, the second metallization layer 32 can also be formed as a shared contact for the pixels 2a, 2b. In this case, the pixels are each electrically conductively connected to the associated switch via the first metallization layer 31.

The first metallization layer and the second metallization layer are thus used in the described exemplary embodiment both for the electrical contacting of the pixels and also for a continuous protection of the carrier 5 having the driver circuit 54 from radiation which is emitted from the active regions 20 and the radiation conversion elements 6.

Notwithstanding the described exemplary embodiment, the driver circuit 54 can also be formed separately from the carrier 5. For example, the driver circuit can be formed by means of one or more layers which are arranged between the at least one semiconductor body having the semiconductor layer sequence 2 and the carrier. The layers can be deposited, for example, by means of a deposition method, for example, by means of PECVD, on the semiconductor body having the semiconductor layer sequence 2, before the semiconductor body having the semiconductor layer sequence is fastened on the carrier 5. For example, the driver circuit 54 can comprise a polycrystalline semiconductor material, for example, polycrystalline silicon. To produce the semiconductor material, amorphous material can be deposited and subsequently recrystallized. In comparison to amorphous semiconductor material, polycrystalline or monocrystalline semiconductor material can have a strongly increased charge carrier mobility. For example, by way of the recrystallization of amorphous silicon, a charge carrier mobility can be achieved which is half of the value for monocrystalline material or more. Due to the use of polycrystalline semiconductor material instead of amorphous semiconductor material, simplified switches can thus be formed in the driver circuit, which are capable of also switching the currents required for generating radiation in the pixels of the display device. The recrystallization can be performed, for example, by means of a laser beam, which is guided in a scanning method over the surface of the amorphous layer. The recrystallization can be performed over the entire surface or only regionally. The recrystallization can also be performed in a multistep process. Aligned bonding for fastening a carrier to a driver circuit integrated in the carrier can be omitted.

In this case, alternatively to a semiconductor material, an electrically insulating material, for example, a ceramic, can also be used for the carrier. The connecting layer 7 is arranged in this case between the driver circuit 54 and the carrier 5 and can also be formed to be electrically insulating. The metallization layers 31, 32 are arranged between the semiconductor body 2 and the driver circuit and thus protect the driver circuit from the radiation which is generated in the semiconductor body and emitted in the direction of the driver circuit.

The second exemplary embodiment which is schematically illustrated in FIG. 2 substantially corresponds to the first exemplary embodiment described in conjunctions with FIGS. 1A and 1B. In contrast thereto, adjacent pixels 2a, 2b are separated from one another by means of a trench 26. The trenches extend from the radiation exit surface 29 at least through the active region, preferably through the entire semiconductor layer sequence 2. Segments 20a, 20b of the active region 20b, which are arranged between the trenches 26, each form the pixels 2a, 2b. The pixels 2a, 2b can be optically and electrically separated from one another in a simplified manner by means of the trenches. For a solely optical separation of the pixels, the trenches can also only extend from the radiation exit surface 29 into the first semiconductor layer 21, without severing the active region 20. Such trenches can also be used in the case of a continuous first semiconductor layer 21, as described, for example, in conjunction with FIGS. 1A and 1B.

The lateral surfaces of the trenches 26 are covered using the second insulation layer 42. The trenches can be unfilled or can be filled using a filler material. The filler material can be formed to be transmissive, absorbent, or reflective for the radiation generated in the active region 20. The optical separation between adjacent pixels can be increased using an absorbent or reflective filler material. For example, a dielectric material, such as a polymer material, is suitable as a transparent or absorbent filler material. A metal layer or a plastic filled with reflective particles, for example, titanium oxide, can be used as a reflective material. If a dielectric material is used as a filler material, the second insulation layer 42 on the lateral surfaces of the trenches 26 can also be omitted.

Furthermore, a pixel 2a, in contrast to those in the exemplary embodiment shown in FIGS. 1A and 1B, comprises multiple recesses 25 for contacting the first semiconductor layer 21. Multiple recesses per pixel are suitable in particular for display devices having comparatively large pixels 2a, 2b, for example, in a display device for a pixelated headlight.

Figure 3:
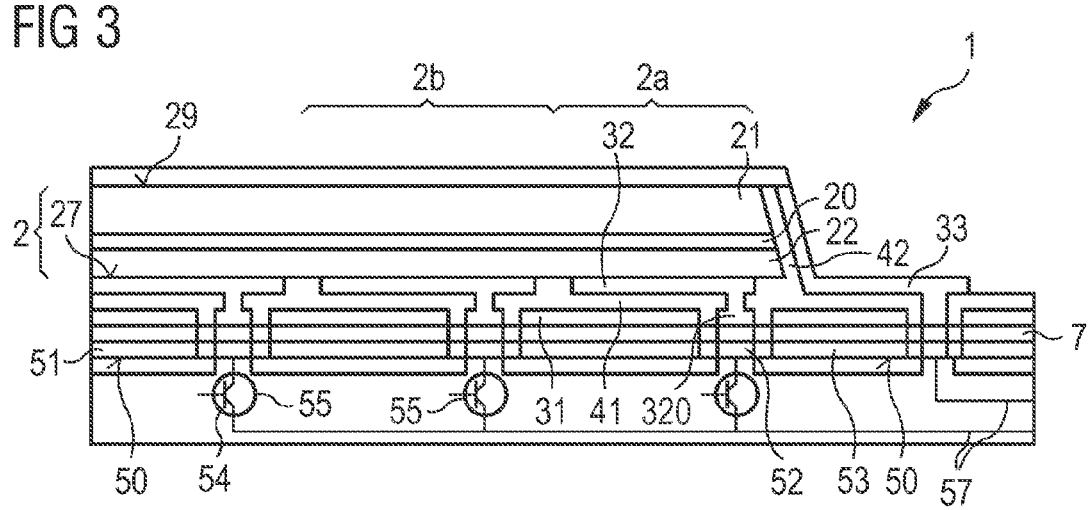

The third exemplary embodiment shown in FIG. 3 substantially corresponds to the first exemplary embodiment described in conjunction with FIGS. 1A and 1B. In contrast thereto, the electrical contacting of the first semiconductor layer 21 is performed via a terminal layer 33 arranged on the radiation exit surface 29. The terminal layer is transmissive for the radiation generated in operation. For example, the terminal layer contains a TCO material, for example, ITO or zinc oxide. The terminal layer 33 is connected to a feed line 57 of the carrier and forms a shared contact for the first semiconductor layer. The first metallization layer 31, in contrast, is not used for the electrical contacting of the pixels, but rather is additionally provided, together with the second metallization layer 32, to shield the carrier 5 having the driver circuit 54 continuously from radiation emitted in operation of the display device 1. In this exemplary embodiment, as described in conjunction with FIG. 2, a trench can also be formed between adjacent pixels in each case. Furthermore, a radiation conversion element can also be arranged on the terminal layer 33, as described in conjunction with FIGS. 1A and 1B.

Figure 4:
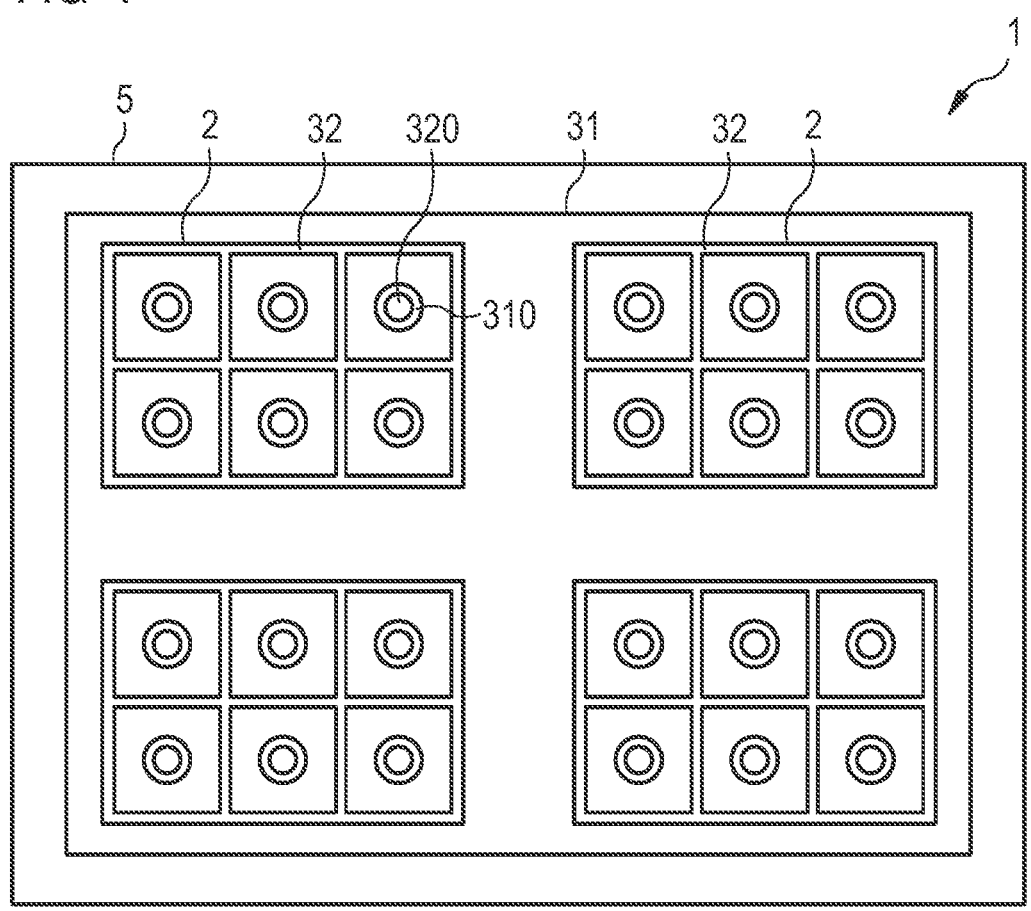
FIG. 4 shows a fourth exemplary embodiment of a display device in a schematic top view.

The fourth exemplary embodiment shown in FIG. 4 substantially corresponds to the first exemplary embodiment described in conjunctions with FIGS. 1A and 1B. In contrast thereto, a plurality of semiconductor bodies 2 is arranged adjacent to one another on the carrier 5. For simplified illustration, only the borders of the semiconductor bodies 2 and the metallization layers 31, 32 having the cutouts 310 and the through contacts 320 are shown in the figure. The display device comprises four semiconductor bodies 2, for example, each having six pixels 2a, 2b. The number of the pixels per semiconductor body and the number of the semiconductor bodies can be varied in broad limits, however. The first metallization layer 31 covers the carrier 5 over a large area, in particular between adjacent pixels 2a, 2b and between adjacent semiconductor bodies 2. The cutouts 310 of the first metallization layer 31 are completely covered by the second metallization layer 32, so that, below the semiconductor bodies 2 and between the semiconductor bodies 2, no direct optical path exists between the active regions 20 and the carrier having the driver circuit 54. The carrier 5 can be formed as free of both metallization layers only in regions of the carrier in which damage impairing the functional capability due to radiation is not to be expected, for example, outside an outer border of the semiconductor bodies 2.

During the production of the display device 1, the semiconductor bodies 2 can be fastened sequentially on the carrier 5. The carrier can be provided in this case in a wafer composite, which is subsequently isolated into the display devices. The spacing between adjacent semiconductor bodies 2 can in particular be between 0.5 µm inclusive and 100 µm inclusive. In particular, the spacing between adjacent pixels within a semiconductor body 2 can be as large as a spacing between adjacent semiconductor bodies.

The invention is not restricted by the description on the basis of the exemplary embodiments. Rather, the invention comprises every novel feature and every combination of features, which includes in particular every combination of features in the patent claims, even if this feature or this combination is not explicitly specified itself in the patent claims or the exemplary embodiments.

The invention claimed is:

1. A display device comprising:
    a semiconductor body comprising a semiconductor layer sequence that includes an active region provided for generating radiation, the semiconductor layer sequence including a plurality of pixels;
    a driver circuit comprising a plurality of switches, wherein each switch is electrically coupled to and configured to control at least one pixel;
    a first metallization layer; and
    a second metallization layer electrically insulated from the first metallization layer,
    wherein the first and second metallization layers are arranged between the driver circuit and the semiconductor body,
    wherein the first metallization layer or the second metallization layer is electrically conductively connected to at least one pixel, and
    wherein the first metallization layer and the second metallization layer are arranged overlapping with one another so that all locations of the drive circuit that overlap with one of the pixels and all locations of the drive circuit between two adjacent pixels in a top view of the display device are covered by at least one of the first and second metallization layers.

2. The display device according to claim 1, wherein the first metallization layer and the second metallization layer are electrically conductively connected to at least one of the pixels.

3. The display device according to claim 1, wherein the first metallization layer or the second metallization layer forms a shared contact for multiple pixels.

4. The display device according to claim 1, wherein the second metallization layer adjoins the semiconductor layer sequence and is severed between two adjacent pixels.

5. The display device according to claim 1, wherein the second metallization layer is completely covered by the semiconductor body in a top view of the display device.

6. The display device according to claim 1, wherein the first metallization layer comprises a cutout for each pixel, the second metallization layer being electrically conductively connected to an associated switch of the driver circuit through the cutout.

7. The display device according to claim 6, wherein the cutout comprises a ring-shaped border.

8. The display device according to claim 1, further comprising a carrier, the semiconductor body being arranged on the carrier.

9. The display device according to claim 8, wherein the driver circuit is integrated into the carrier.

10. The display device according to claim 8, wherein the driver circuit is arranged between the semiconductor body and the carrier.

11. The display device according to claim 10, wherein the driver circuit is deposited on the semiconductor body.

12. The display device according to claim 10, wherein the driver circuit comprises a polycrystalline semiconductor material.

13. The display device according to claim 8, wherein a plurality of semiconductor bodies, each having a plurality of pixels, is arranged on the carrier.

14. The display device according to claim 13, wherein the first metallization layer and the second metallization layer are arranged overlapping with one another so that the carrier is covered with at least one of the first and second metallization layers in a top view of the display device at any point which overlaps with one of the semiconductor bodies or is arranged between two adjacent semiconductor bodies.

15. The display device according to claim 8, wherein the semiconductor layer sequence has physical characteristics consistent with having been grown on a grown substrate that was subsequently removed, and wherein the carrier mechanically stabilizes the semiconductor layer sequence.

16. The display device according to claim 1, wherein
    the active region is arranged between a first semiconductor layer and a second semiconductor layer, and wherein the semiconductor layer sequence comprises a recess that extends from a rear side of the semiconductor layer sequence facing toward the driver circuit through the active region into the first semiconductor layer and is provided for electrically contacting the first semiconductor layer.

17. The display device according to claim 1, wherein the pixels are electrically contacted from a radiation exit surface facing away from the driver circuit.

18. The display device according to claim 1, wherein the active region extends continuously over multiple pixels.

19. The display device according to claim 1, wherein the active region is subdivided into a plurality of segments, each segment forming a pixel, wherein the segments originate from a shared semiconductor layer sequence.

20. The display device according to claim 1, further comprising a radiation conversion element arranged on a side of the semiconductor layer sequence facing away from the driver circuit.

* * * * *